United States Patent [19]

Pham et al.

[11] Patent Number: 5,669,545
[45] Date of Patent: Sep. 23, 1997

[54] ULTRASONIC FLIP CHIP BONDING PROCESS AND APPARATUS

[75] Inventors: C. V. Pham, Northville; Brian J. Hayden, Royal Oak; Bethany J. Walles, Birmingham, all of Mich.

[73] Assignee: Ford Motor Company, Dearborn, Mich.

[21] Appl. No.: 743,580

[22] Filed: Nov. 4, 1996

Related U.S. Application Data

[60] Division of Ser. No. 494,217, Jun. 23, 1995, which is a continuation-in-part of Ser. No. 239,106, May 6, 1994, Pat. No. 5,427,301.

[51] Int. Cl.⁶ .......................... B23K 20/10; H01C 21/607
[52] U.S. Cl. ........................................ 228/1.1; 228/5.5
[58] Field of Search ........................ 228/1.1, 5.5, 6.2, 228/44.7, 49.5; 156/73.1, 580.1; 425/174.2; 72/710; 604/22

[56] References Cited

U.S. PATENT DOCUMENTS 3,563,443  2/1971  Pedrotti et al. ................. 228/1.1
4,411,721  10/1983  Wishart .......................... 156/580.1
5,341,979  8/1994  Gupta ............................ 228/180.22
5,591,298  1/1997  Goodman et al. ................ 156/580.1

*Primary Examiner*—Samuel M. Heinrich
*Attorney, Agent, or Firm*—Richard D. Dixon

[57] ABSTRACT

A process for bonding a flip chip (20), of the type having an active face provided with conductive bumps, to a substrate (22) so that its active face is oriented toward the substrate (22). The flip chip (20) is coupled through a vacuum to the distended end (32) of an ultrasonic horn (30) and then lowered onto the substrate (22) so that the bumps (20b) align with a bonding pattern on the substrate (22). A bias force is applied through the ultrasonic horn (30) to the backside of the flip chip (20), in a direction normal to the substrate (22) so that minimal lateral displacement of the flip chip (20) and the substrate (22) results. The ultrasonic horn (30) is then activated while the bias force is applied such that the ultrasonic energy is isothermally transferred in a direction normal to and across the flip chip (20) to the substrate (22) for creating a diffusion bond therebetween.

10 Claims, 19 Drawing Sheets

APPLIED FORCE & ULTRASONIC ENERGY FOR FLIP CHIP BONDING

APPLIED FORCE & ULTRASONIC ENERGY FOR FLIP CHIP BONDING

ULTRASONIC FLIP CHIP BONDING PROCESS AND APPARATUS

This is a divisional of application Ser. No. 08/494,217 filed Jun. 23, 1995, which is a continuation-in-part of application Ser. No. 08/239,106, filed May 6, 1994 now U.S. Pat. No. 5,427,301.

TECHNICAL FIELD

This invention relates to an improved apparatus and method for bonding flip chip devices onto a substrate, such as a circuit board. More specifically, the invention is a semi-automatic system which enables high alignment and bonding accuracy of flipped chips to a substrate.

BACKGROUND ART

Flip chip bonding has emerged as one of the fastest growing technologies in packaging electronic components. Such technologies have developed in response to the demand for circuits which may operate at high speeds in high packing densities. Acceptable performance criteria may only be realized by appropriate selection of the substrate, interconnect mechanisms, flip chip design, and the bonding media (manufacturing reliable multi-chip modules).

Several methods may be used to attach a flip chip or die to a substrate. Solder is often used for silicon, aluminum nitride, alumina, or flexible substrates. Gold-to-gold thermocompression or ultrasonic bonding are mainly used for high power small devices. Standard conductive epoxy may also be used for flip chip bonding.

Among the issues which need to be considered when designing automated flip chip bonding mechanisms are placement accuracy, the types of flip chips and substrates, flip chip pickup and placement, substrate pickup and placement, throughput, and price.

Illustrative of previous approaches is U.S. Pat. No. 3,938, 722 which discloses an apparatus for bonding flip chip devices onto mating conductive surfaces on a substrate utilizing ultrasonic energy. The bonding tool has a spherically shaped bonding surface which is caused by a pivoting mechanism to bond in a complex wobbling motion. Such approaches, however, may lead to relative lateral motion between the flip chip and the substrate which may jeopardize alignment.

U.S. Pat. No. 4,842,662 discloses a bonding approach wherein no gold globules or bumps are used in advance of the flip chip connection process. Such gold bumps are typically placed on the terminal pad of the flip chip and on the underside of the wire to be connected to the flip chip. The '662 disclosure, however, relates to single point bonding processes adapted for use with tape-automated-bonding (TAB) tape.

U.S. Pat. No. 5,341,979 discloses a thermosonic process for securing a semiconductor die to bonding pads on a substrate using multiple gold bumps. In such a process, heat is applied while ultrasonic energy is coupled to move the die in the horizontal, rather than vertical, plane. In contrast to this prior art, the process utilized in the present invention operates at room temperature, and the ultrasonic energy is delivered substantially isothermally in the form of vertical oscillations.

SUMMARY OF THE INVENTION

The present invention discloses a process and apparatus for bonding a flip chip to a substrate. The process includes the following steps:

1. positioning the flip chip, coupled to an ultrasonic horn, above the substrate, the flip chip having an active face provided with conductive bumps, so that the active face is oriented toward the substrate;

2. lowering the ultrasonic horn for placing the flip chip on the substrate so that the bumps align with a bonding pattern on the substrate;

3. applying through the ultrasonic horn a force to the back side of the flip chip, the force being normal to the substrate so that minimal lateral displacement of the flip chip and the substrate results; and 4. applying a vibration dampening force to areas of the substrate adjacent to the flip chip for reducing the transmission of ultrasonic energy through the substrate;

5. activating the ultrasonic horn while the force is applied so that the ultrasonic energy in the form of oscillations is isothermally transferred across the flip chip to the substrate and a diffusion bond is created therebetween.

The invention also includes the manufacturing apparatus by which to practice the above-noted process.

BEST MODE(S) FOR CARRYING OUT THE INVENTION

The process and method of the present invention represent a system for multi-chip bonding to substrates. The apparatus disclosed can be operated as an accurate pickup and placement mechanism for registering the flip chips in relation to the bonding pattern defined on a substrate.

By way of overall orientation, the apparatus and process of the present invention is used to produce high density packaging applications which require high alignment and bonding accuracy of flipped chips or dies to substrates. The apparatus includes one pickup head and one bonding head. The first head picks up the flip chip from a waffle pack, or sawn wafer on frame, or tape and reel, and places it on an orientor. The second head picks up the die from the orientor and brings it over the substrate. Machine vision is used for final alignment when the die is over the substrate. A vibration damper arm isolates the ultrasonic energy from passing through the substrate and into adjacent dies or components.

As used herein, the term "ultrasonic bonding" includes a solid-state process in which the flip chip is bonded to the substrate by locally applying high-frequency vibratory energy thereto while the surfaces to be joined are held together under bias pressure. It is thought that the diffusion layer may be on the order of 2–3 kilo angstroms in thickness. The disclosed process can be used to bond flip chips to gold, silver, platinum, nickel, or copper metalized patterns on a substrate.

Figure 1:
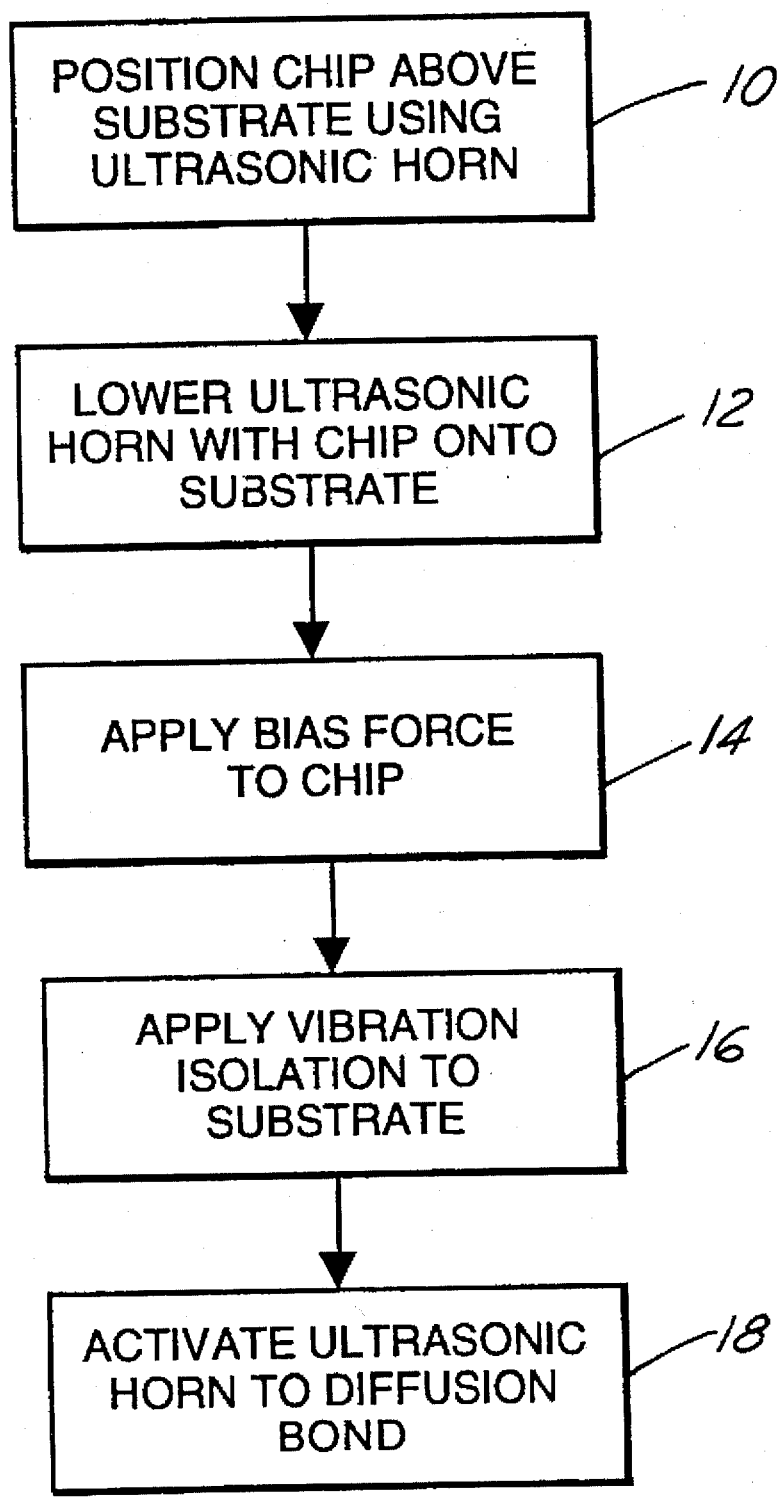
FIGS. 1 is a flow chart of the main process steps of the present invention.

FIG. 1 of the drawings is a flow chart of the main process steps used for practicing the process of the present invention.

The flip chip is coupled through a vacuum force to the end of an ultrasonic horn and then positioned (10) above the substrate. Conventionally, the flip chip has an active face which is provided with gold globules or bumps. The active face is oriented toward the substrate. Next, the ultrasonic horn is lowered to place the flip chip on the substrate (12) so that the bumps align with a bonding pattern which is formed on the substrate. A bias force is then applied (14) through the ultrasonic horn to the back side of the flip chip so that the force is normal to the substrate. In this way, minimum lateral displacement of the flip chip in relation to the substrate results. A vibration damping medium is then placed onto the substrate adjacent the flip chip for inhibiting the transfer of vibrations and ultrasonic energy (16) from the flip chip, through the substrate and outwardly to adjacent electronic devices and other components previously mounted on the substrate. Finally, the ultrasonic horn is activated (18) while the bias force is applied so that ultrasonic energy is isothermally transferred across the flip chip to the substrate for carrying a diffusion bond therebetween.

Figure 2:
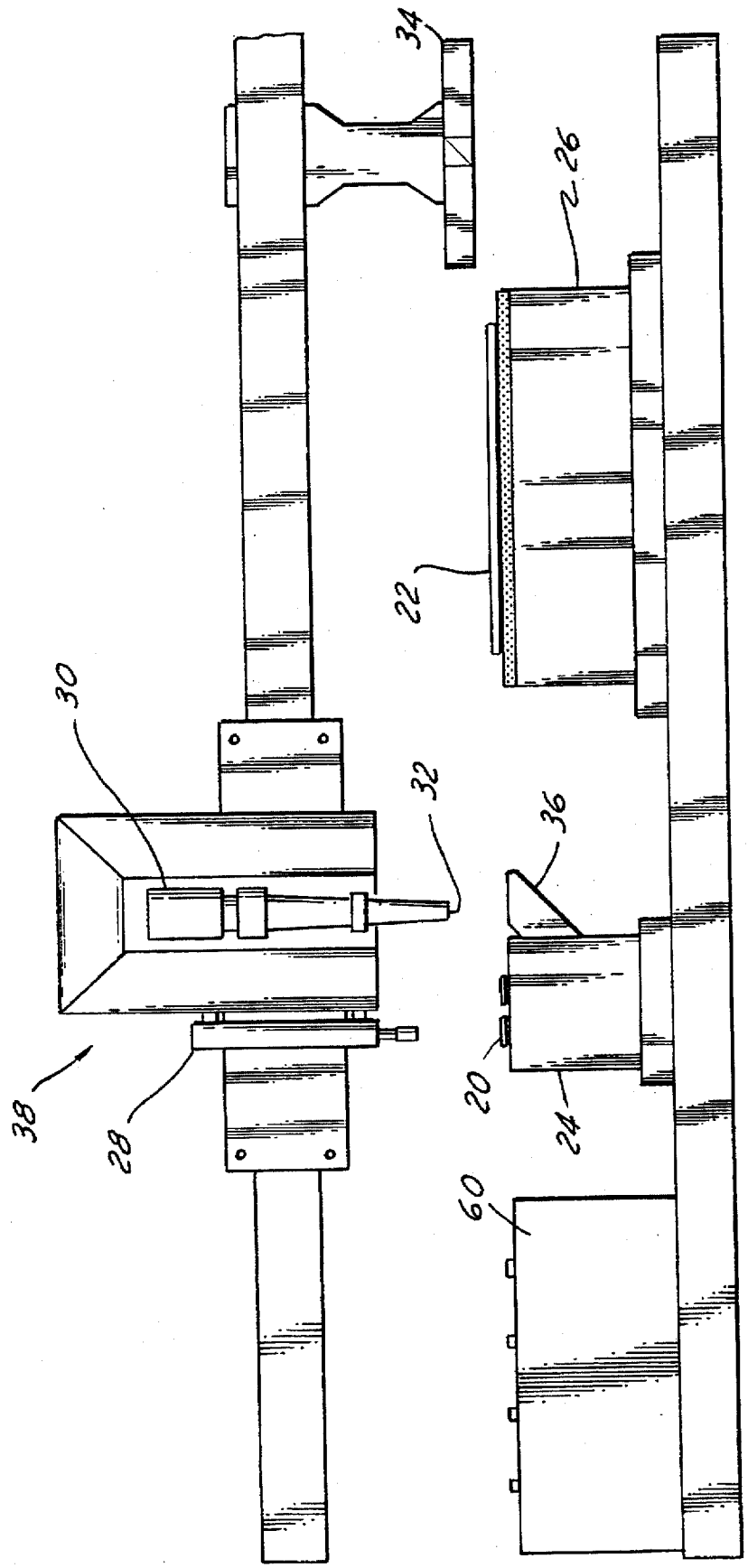
FIGS. 2–14 are side elevational views and depict various process steps and apparatus configurations used in bonding a flip chip to a substrate according to the teachings of the present invention.
Figure 3:
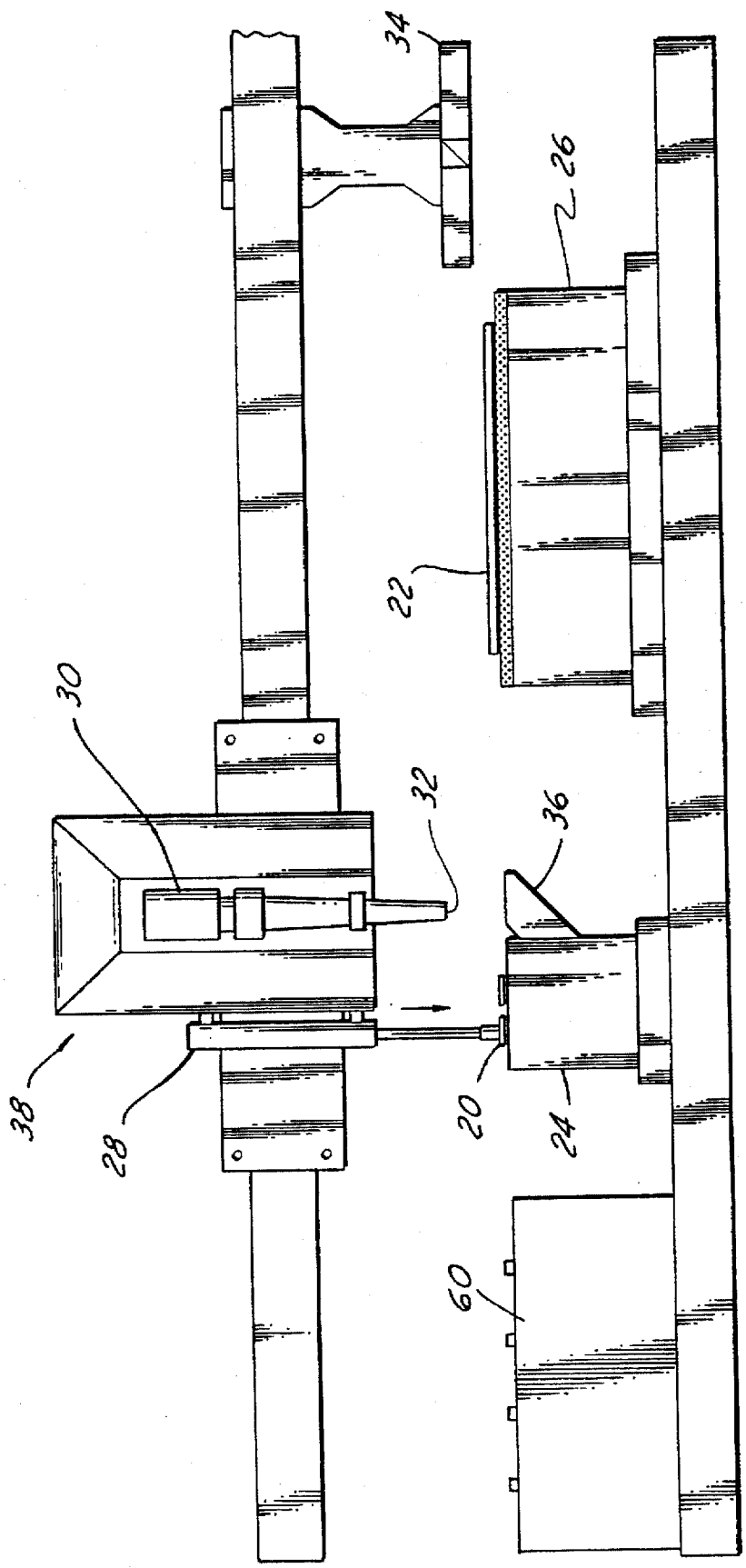

FIGS. 2–14 depict the apparatus and process steps in more detail. FIG. 2 depicts the main components of the apparatus used to practice the process disclosed and claimed herein. In FIG. 2, a flip chip 20 is loaded onto a flip chip pickup table 24. While a flip chip is described with respect to the best mode of the invention, the process may be used with a die comprising a variety of materials, such as silicon, gallium arsenede, ceramic, metal, and glass. A substrate 22 (such as an FR4 printed wiring board, the base of a multi-chip module, glass, ceramic, or flexible PWB) is positioned upon a work holder 26. In FIG. 3, a vacuum flip chip pickup mechanism 28 is extended to pick up the flip chip 20 by use of vacuum.

Figure 4:
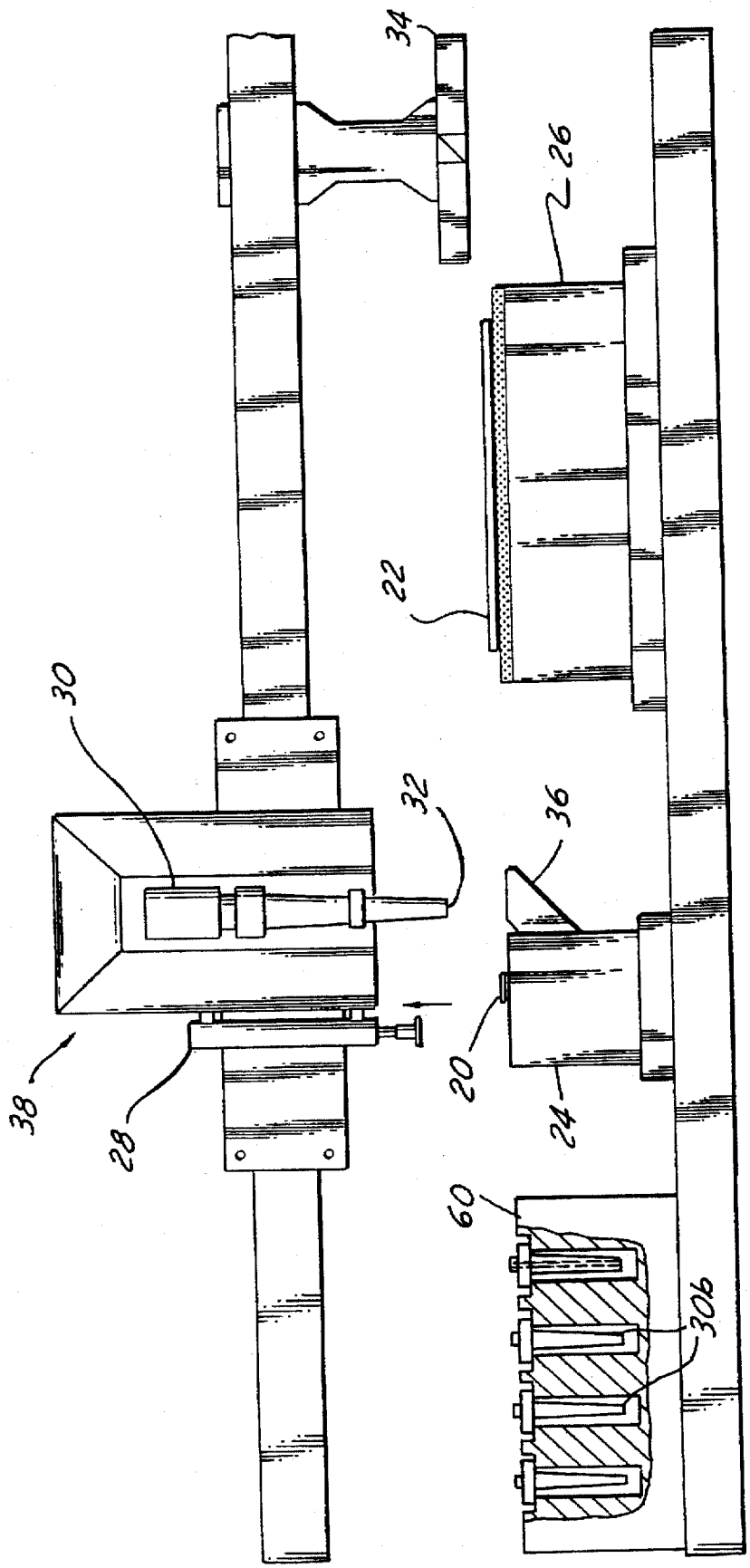
Figure 5:
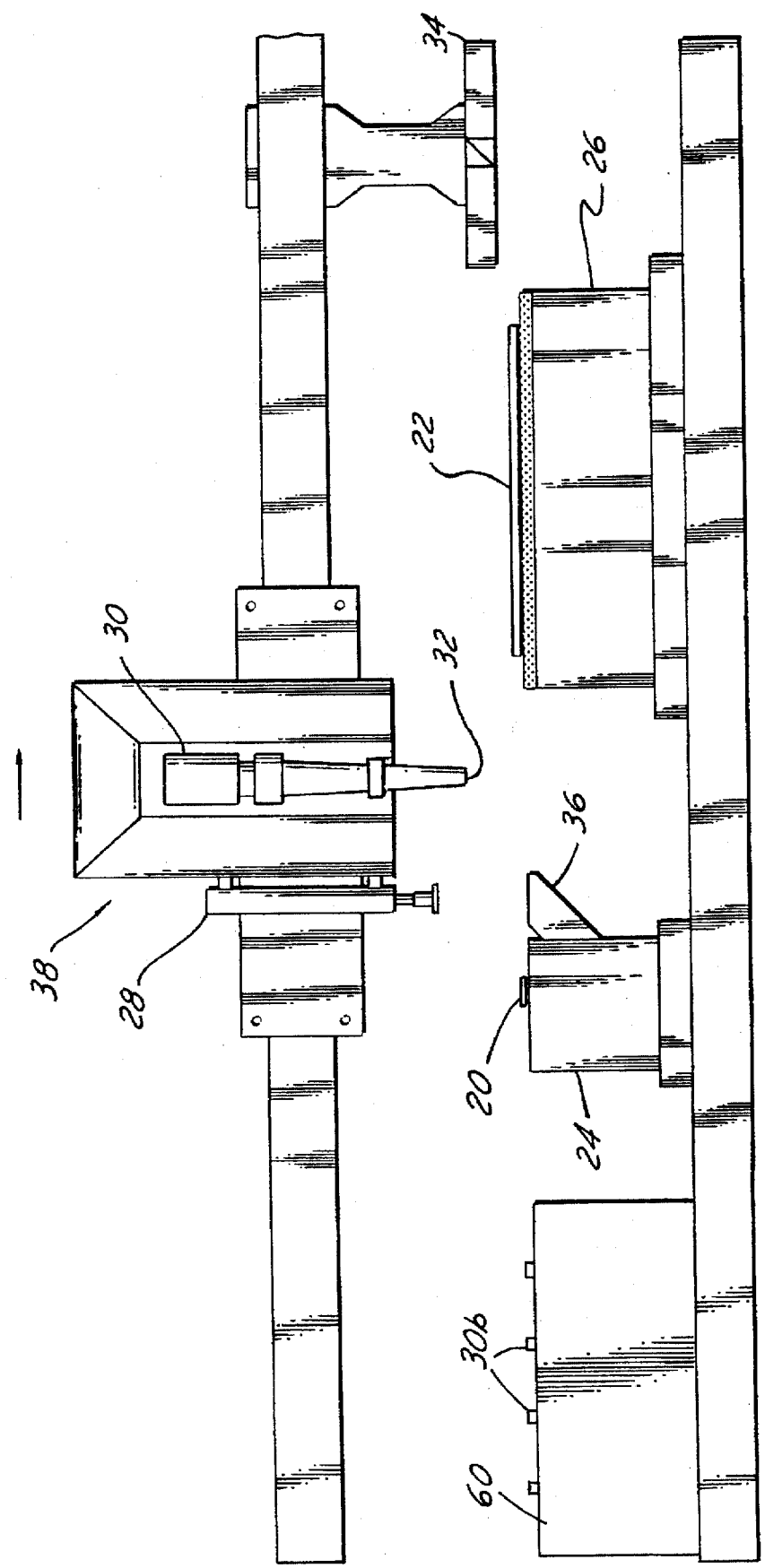
Figure 6:
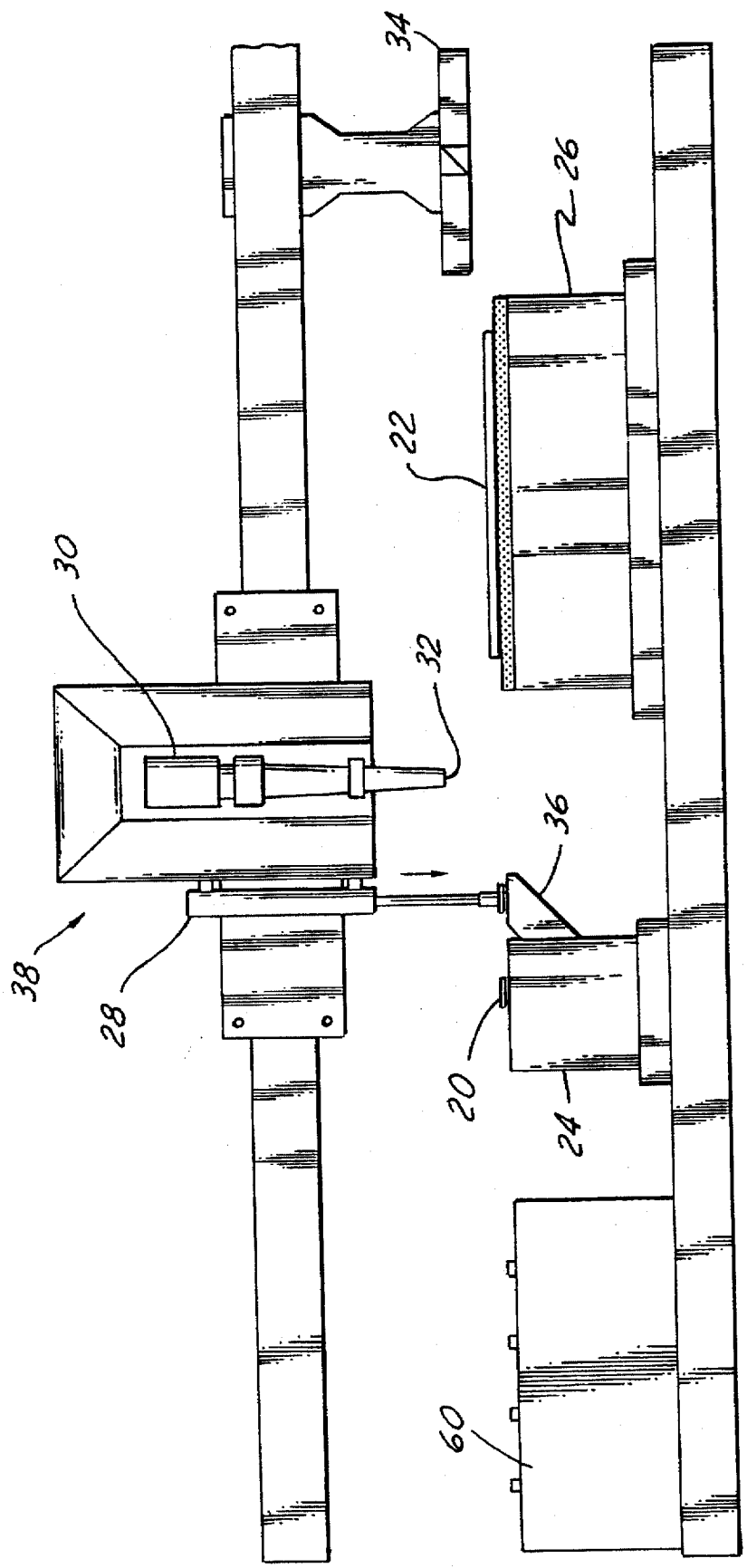
Figure 7:
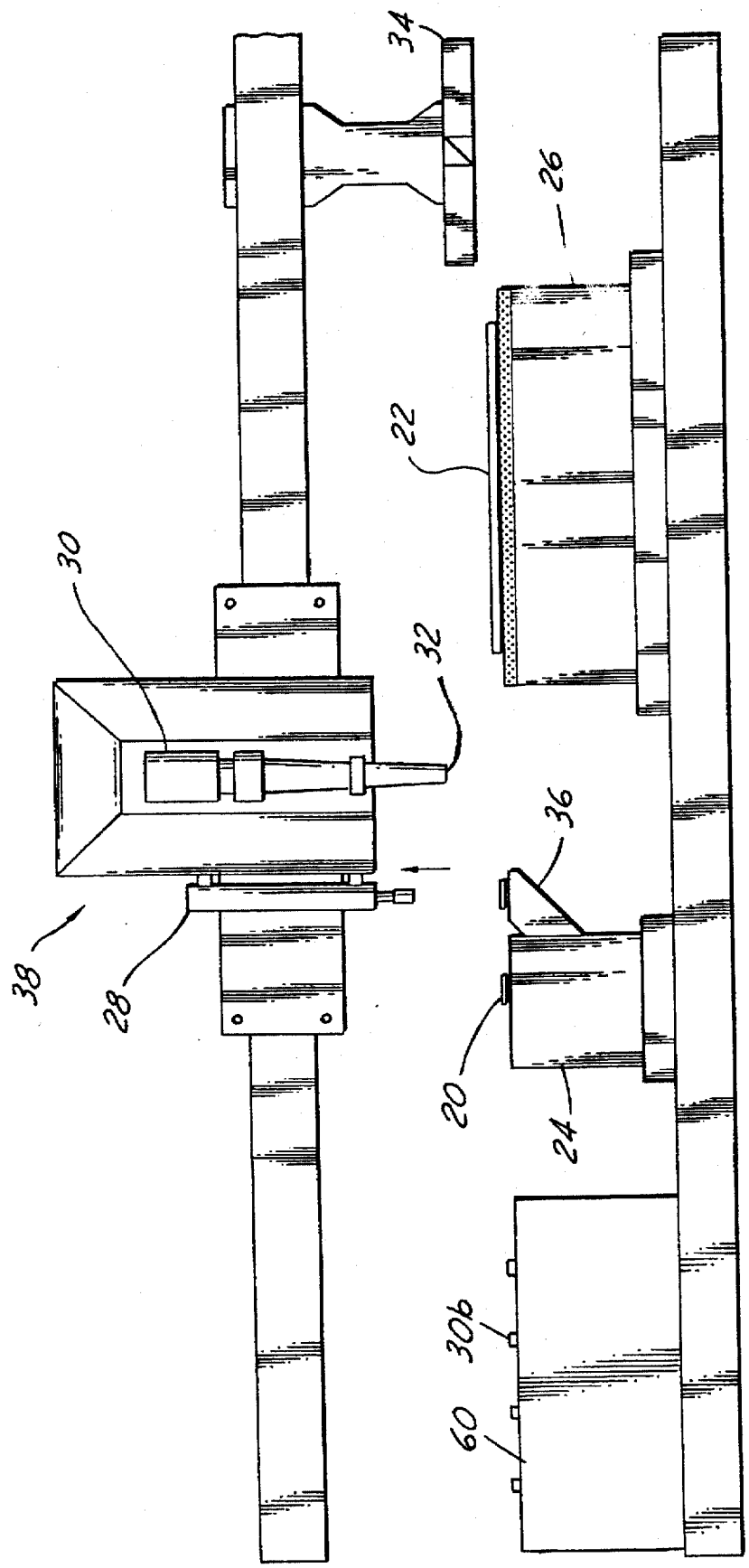

FIG. 4 shows the vacuum flip chip pickup arm retracted in combination, thus elevating the flip chip 20 above the flip chip pickup table 24. In FIG. 5, a stage 38 which includes the vacuum flip chip pickup mechanism 28 and an ultrasonic horn 30 is translated so that the vacuum flip chip pickup arm 28 with the flip chip 20 is aligned with a squaring device 36.

Next, the vacuum flip chip pickup arm 28 (FIG. 6) is extended to place the flip chip 20 onto the squaring device 36. The vacuum flip chip pickup am 28 is then retracted (FIG. 7) and the squaring device 36 is activated to orient the flip chip 20 so that it is square in relation to the substrate 22.

Figure 8:
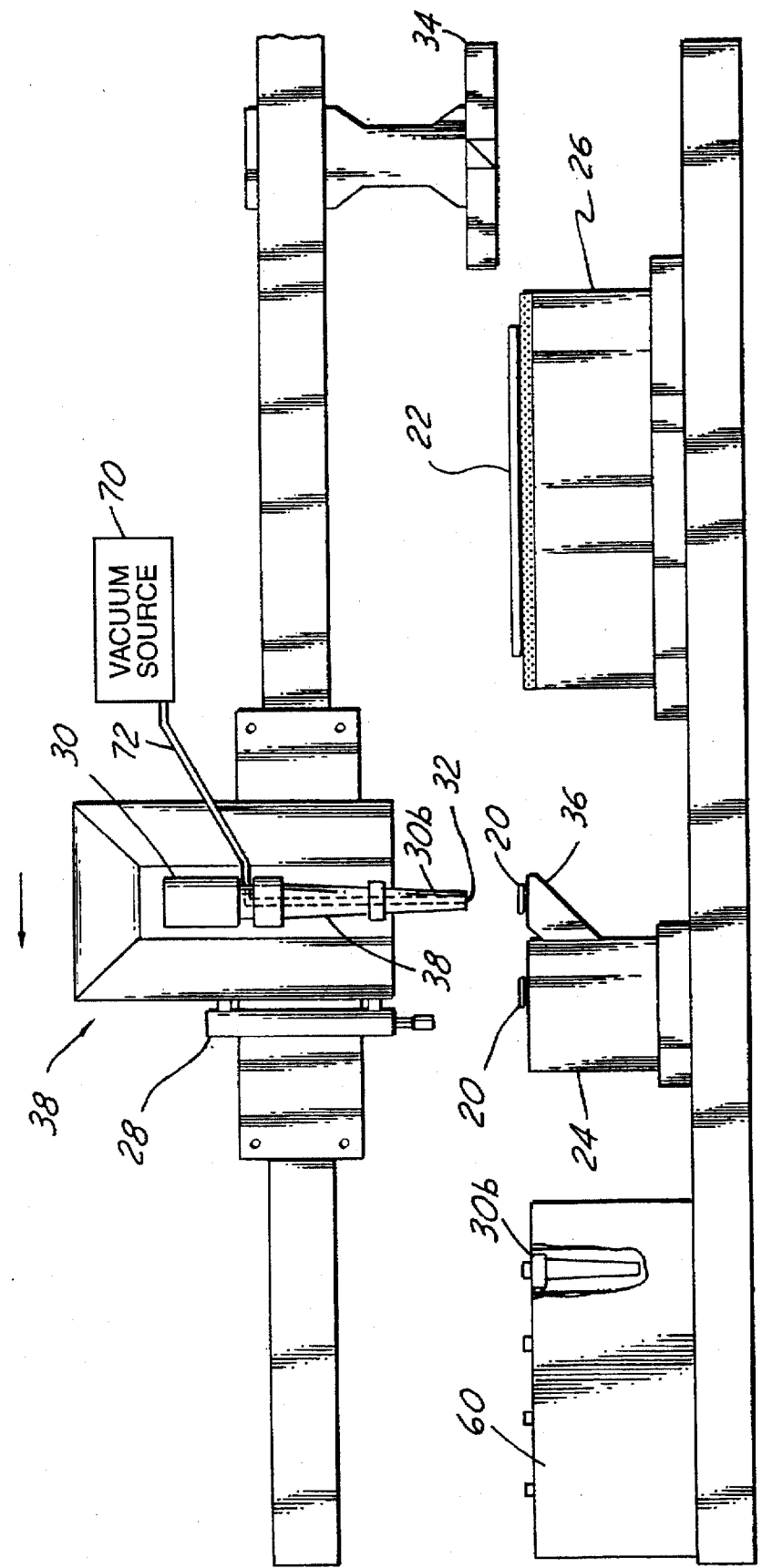
Figure 9:
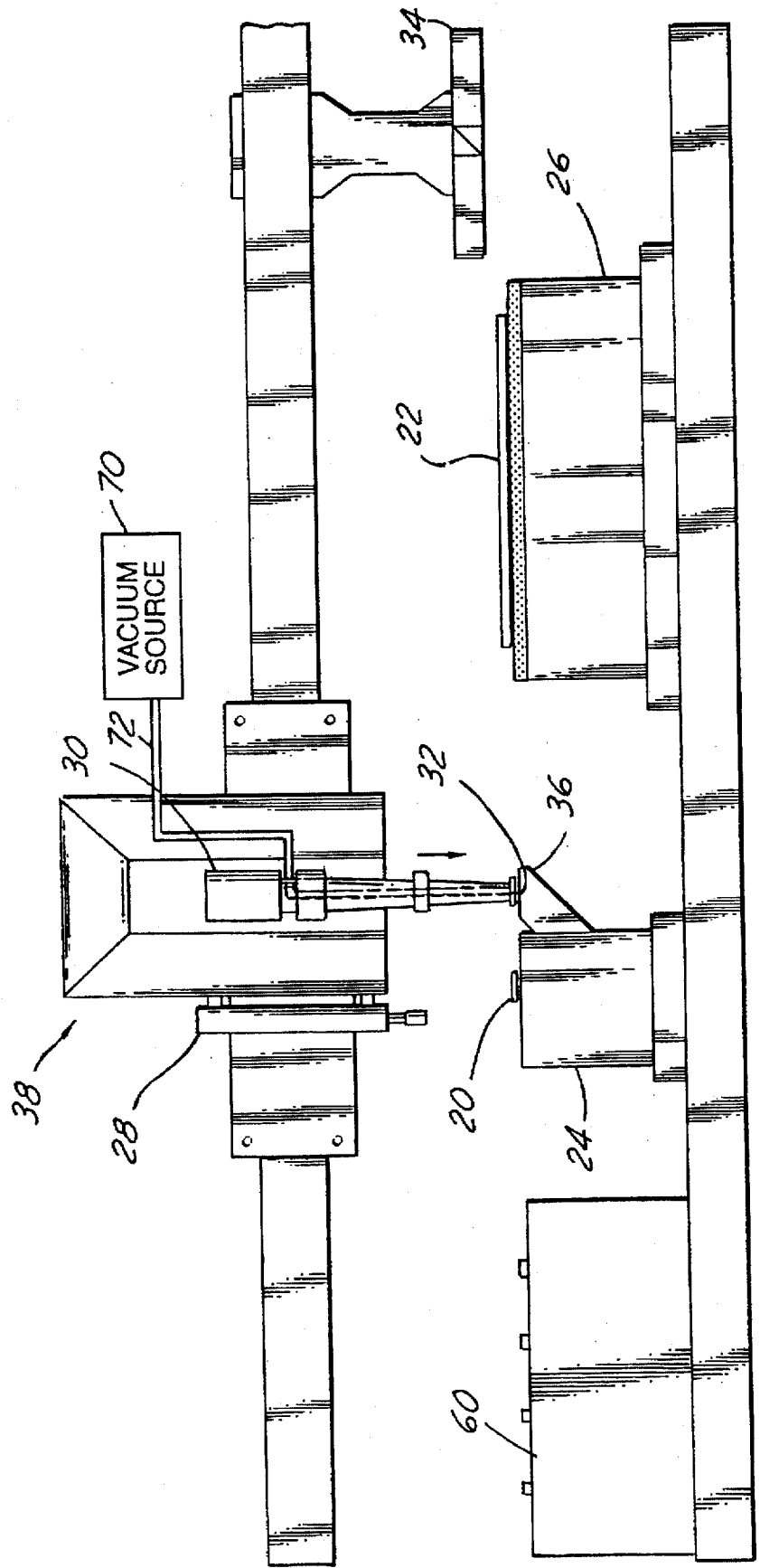

In FIG. 8, an appropriate distended section 30b is selected from a nest 60 and attached through a snap connector 31 to the actuator section 30a to form the ultrasonic horn 30. This coupling is more clearly shown in FIG. 12b. The snap connector 31 includes an O-ring section for sealing the internal vacuum channel 30a. The snap connector 31 must be located at a position that will not adversely interfere with the resonance and desired vertical motion of the ultrasonic bonding tool 30. Next, the stage 38 is translated so that the ultrasonic horn 30 is aligned with the squaring device 36. The distended end 32 of the ultrasonic horn 30 is then extended (FIG. 9) to pick up the flip chip 20 from the squaring device 36 using a vacuum. The distended end 32 of the stainless steel ultrasonic horn 30 does not require any special finishing (other than normal buffing and polishing), hence there is no requirement to "hold" the die 20 against horizontal displacement forces. The vacuum is delivered through a channel 30c which extends axially through the ultrasonic horn 30 to a supply of negative pressure 70. While the disclosed horn may be used for various flip chip sizes, it is advisable to have the distended end 32 of the ultrasonic horn 30 slightly smaller in size and similar in shape with respect to the die 20.

Figure 10:
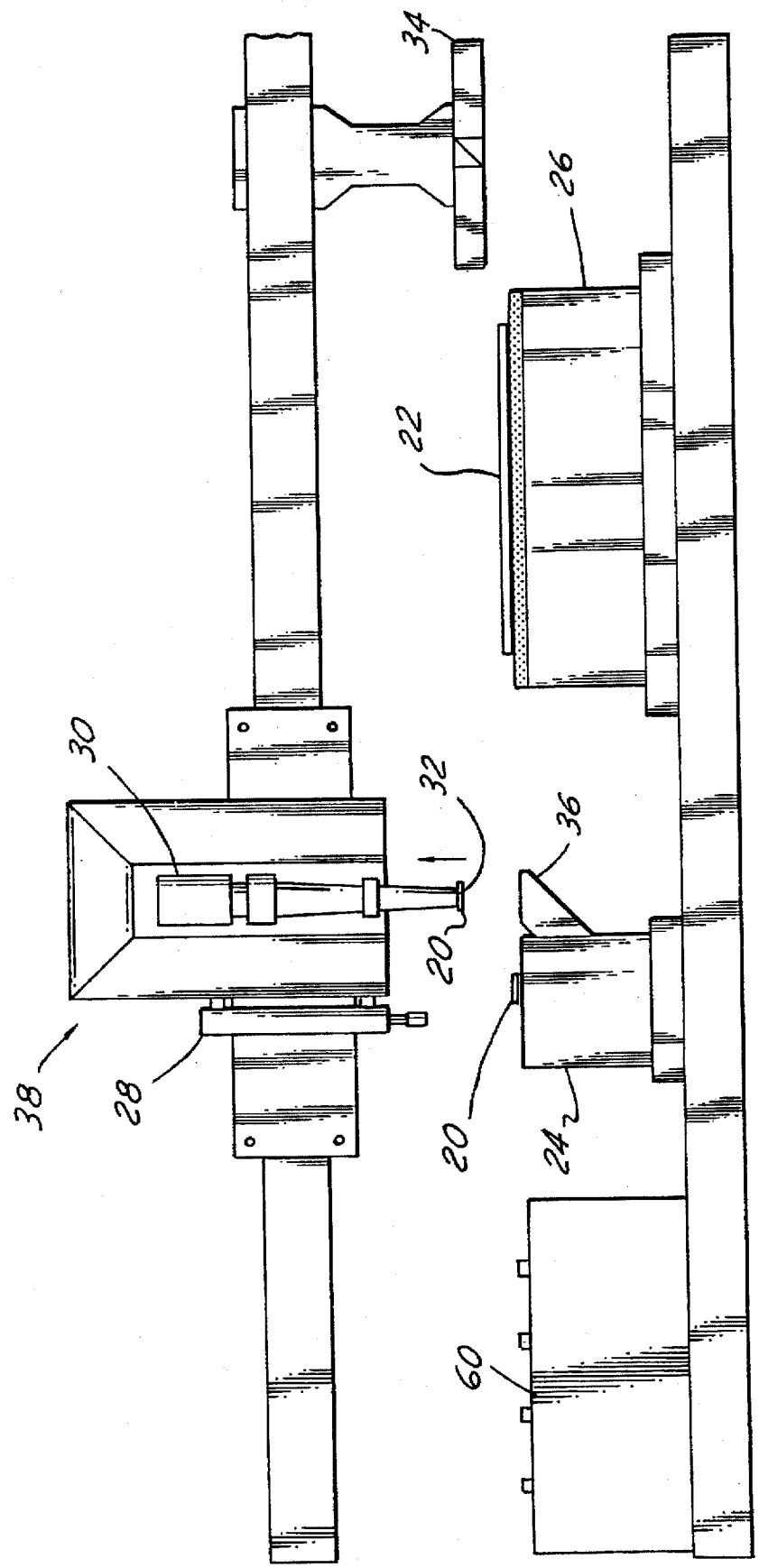
Figure 11:
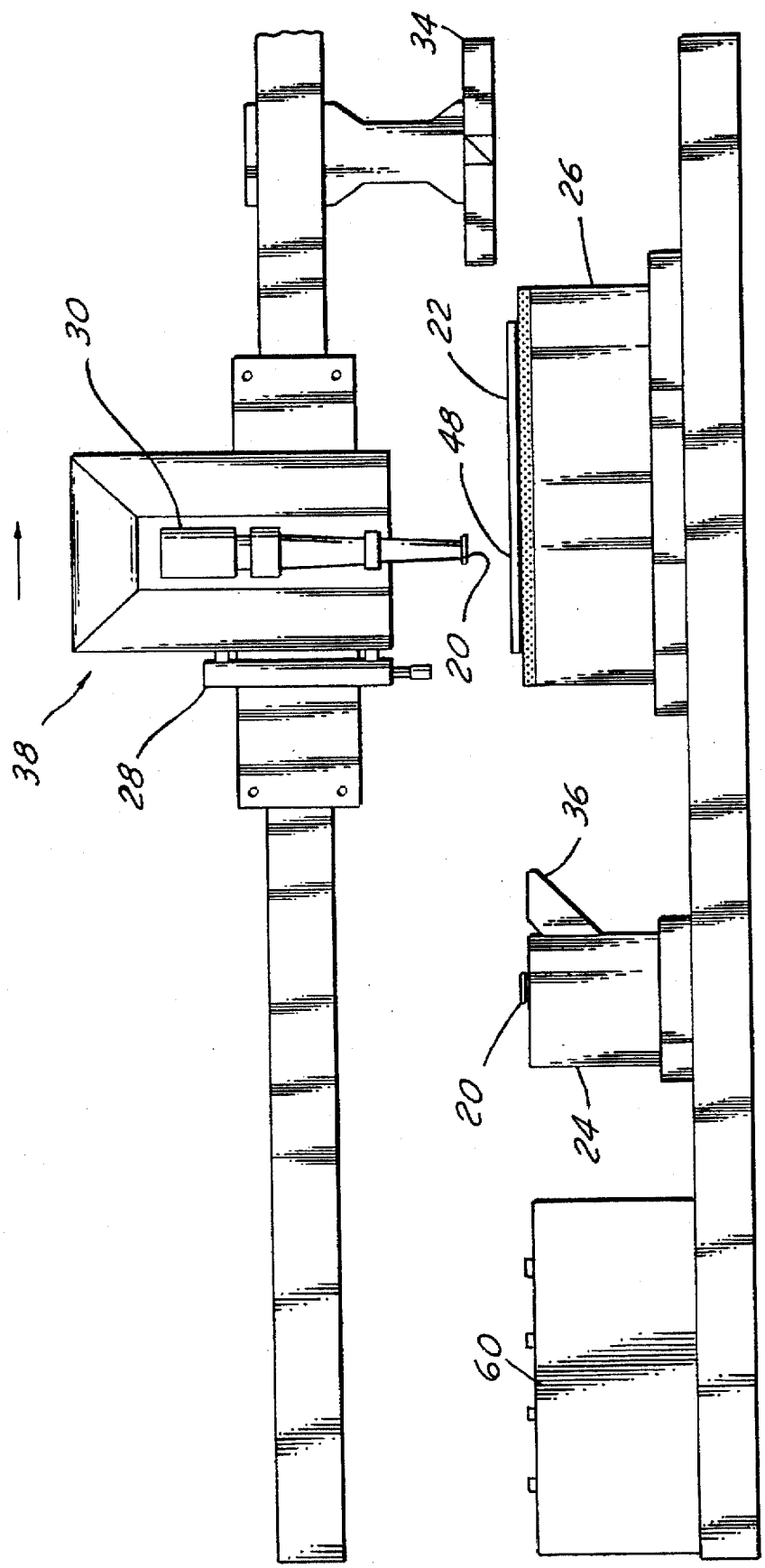

In FIG. 10, the ultrasonic horn 30 is shown as being retracted while carrying the flip chip 20 along with it. In FIG. 11, the stage 38 is translated so that the ultrasonic horn 30, together with the flip chip 20, is aligned opposite a known bonding location 48 defined upon the substrate 22.

Figure 12:
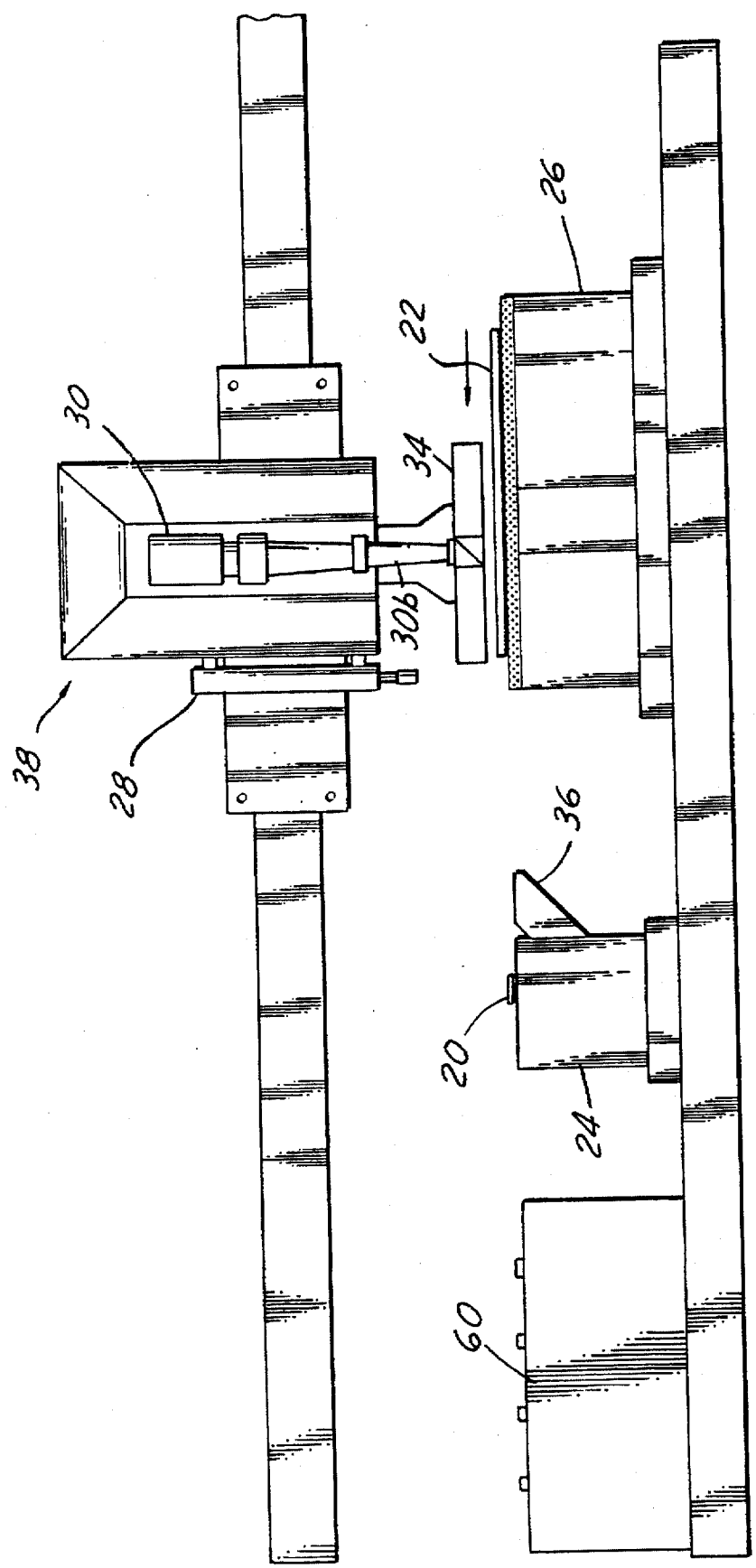

In FIG. 12, a means for alignment, such as an optical device 34, is translated to a location between the flip chip 20 and the substrate 22. Precise alignment of the flip chip 20 in relation to the substrate 22 then commences by manual or automatic means. Although an optical means for aligning has been disclosed, other alignment means may be used, such as split prisms and infrared techniques. After proper alignment of the flip chip 20 is achieved with the fine line conductor traces on the substrate 22, the optical alignment device 34 is moved into a storage location away from the bonding location 48 on the substrate as illustrated in FIG. 12a.

Figure 12A:
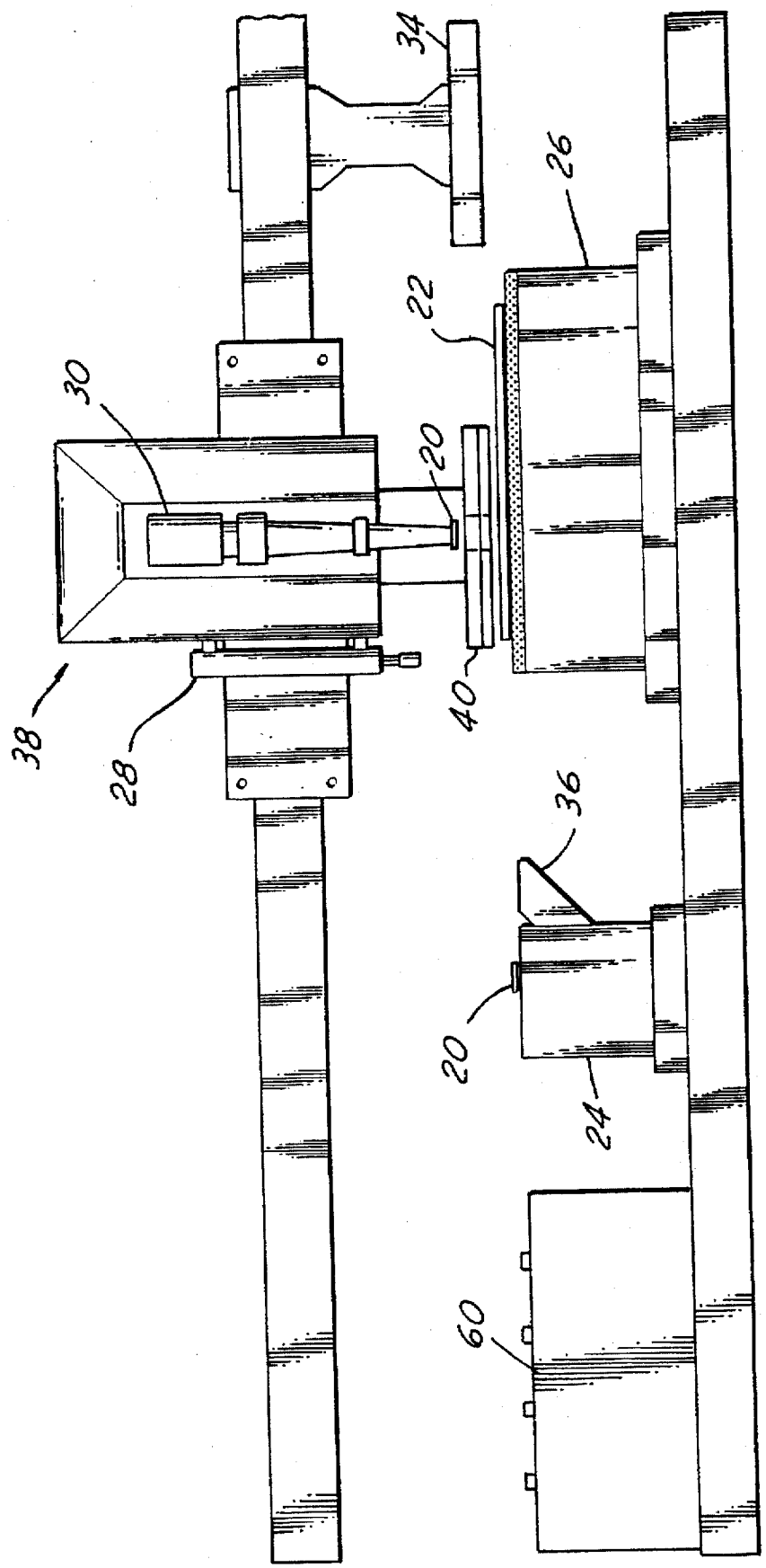
FIGS. 12a and b are side sectional views showing the positioning of the ultrasonic horn, the vibration damper arm and the substrate.
Figures 12B, 12C:
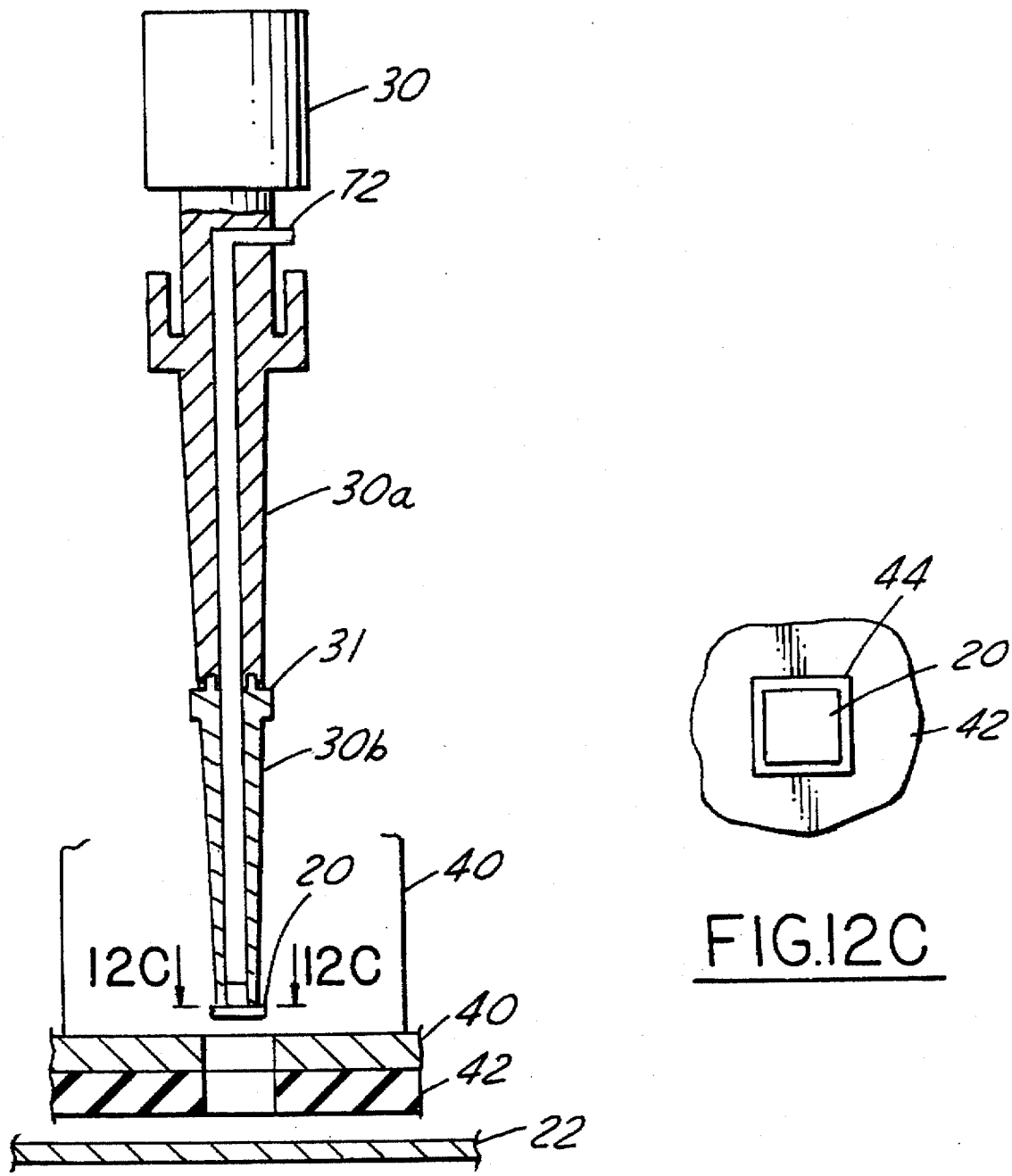
FIG. 12c is a top view of the die and the corresponding aperture within the vibration damper arm.

As illustrated in FIG. 12A, a vibration damper arm 40 is moved into position directly above the known bonding location 48. As illustrated more clearly in FIG. 12B, the vibration damper arm 40 has attached to the underside thereof a rubber pad 42 that is deformable when vertically compressed onto the substrate 22. As illustrated in FIG. 12C, both the vibration damper arm 40 and the rubber pad 42 have defined therein an aperture 44 which is sized and shaped to be just slightly larger than the die 20 and the distended end 32 of the ultrasonic horn 30. In this manner the die 20 may be inserted through the aperture 44 without disturbing the location or alignment of the die 20 with respect to the circuit traces at the known bonding location 48. Note that in FIG. 12B the damper arm 40 and the rubber pad 42 remain spaced above the substrate 22. The damper arm 40 is formed with a horizontally disposed aluminum plate approximately four inches square and 0.25 inches thick. The rubber pad is approximately 0.10 inches thick and is laminated to the underside of the plate. A pneumatic mechanism employing an air piston is coupled to a slide bearing which allows the damper arm 40 to be extended vertically to engage with the substrate 22. While the damper arm 40 is illustrated separately from the carrier 38 for the ultrasonic horn 30 for sake of clarity, in the preferred embodiment the damper arm is actually fixed to and moves with the carrier 38 for the ultrasonic horn 30.

Figure 13:
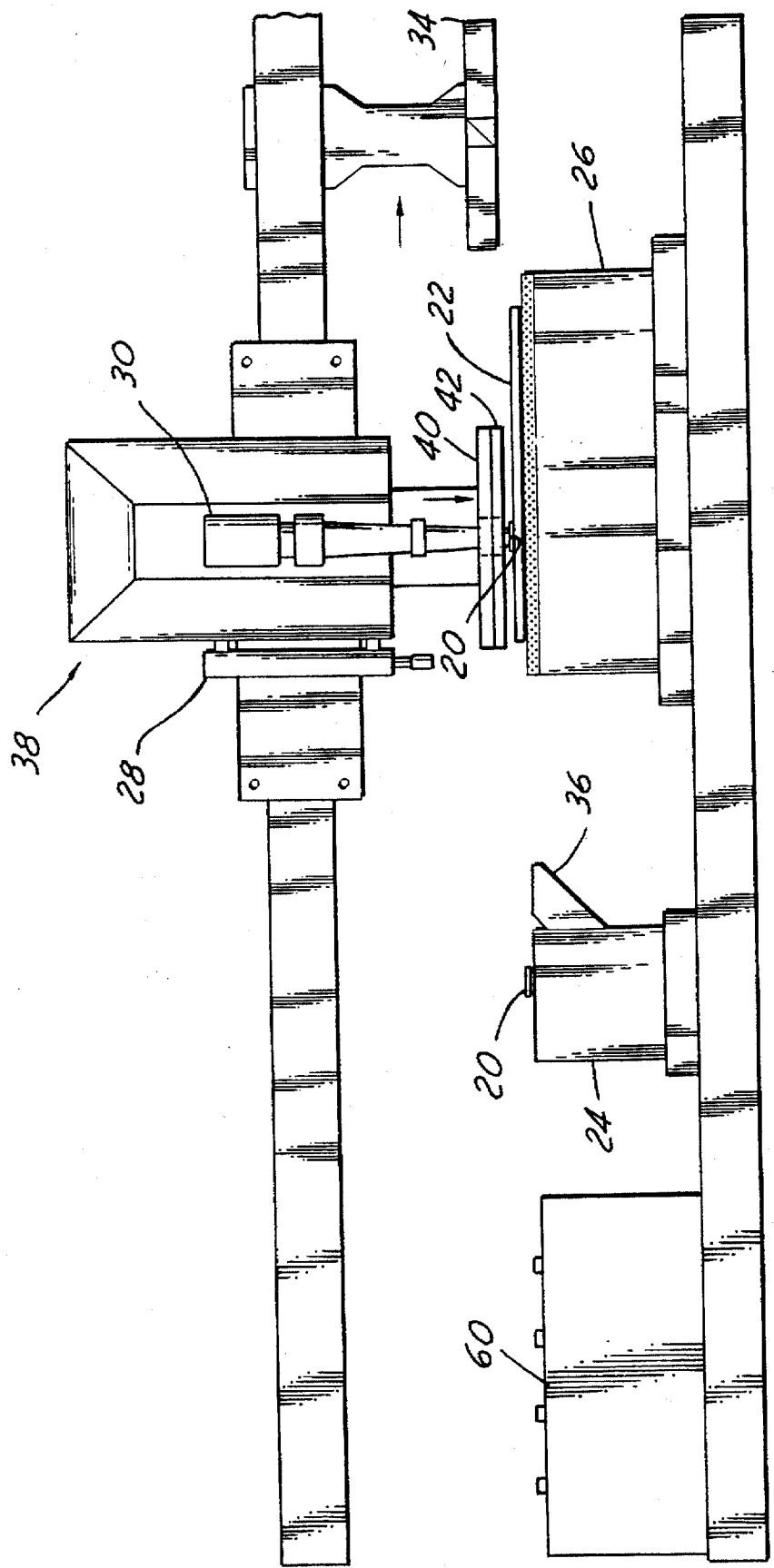

FIG. 13 depicts extension of the ultrasonic horn 30 to bring the flip chip 20 into contact with the substrate 22. A predetermined initial bias force of approximately 10 pounds per square inch is then applied by the ultrasonic horn 30 to press the die 20 against the substrate 22 in known registration. In the preferred embodiment it will be assumed that the die 20 comprises a 300 mill by a 300 mill silicon die having a total of 144 gold bumps on the lower side thereof for being attached to corresponding traces in the substrate 22 which are approximately 5 mils in width and having a gap of 1 mill therebetween. The bump sizes are approximately 5 mils square.

Figure 13A:
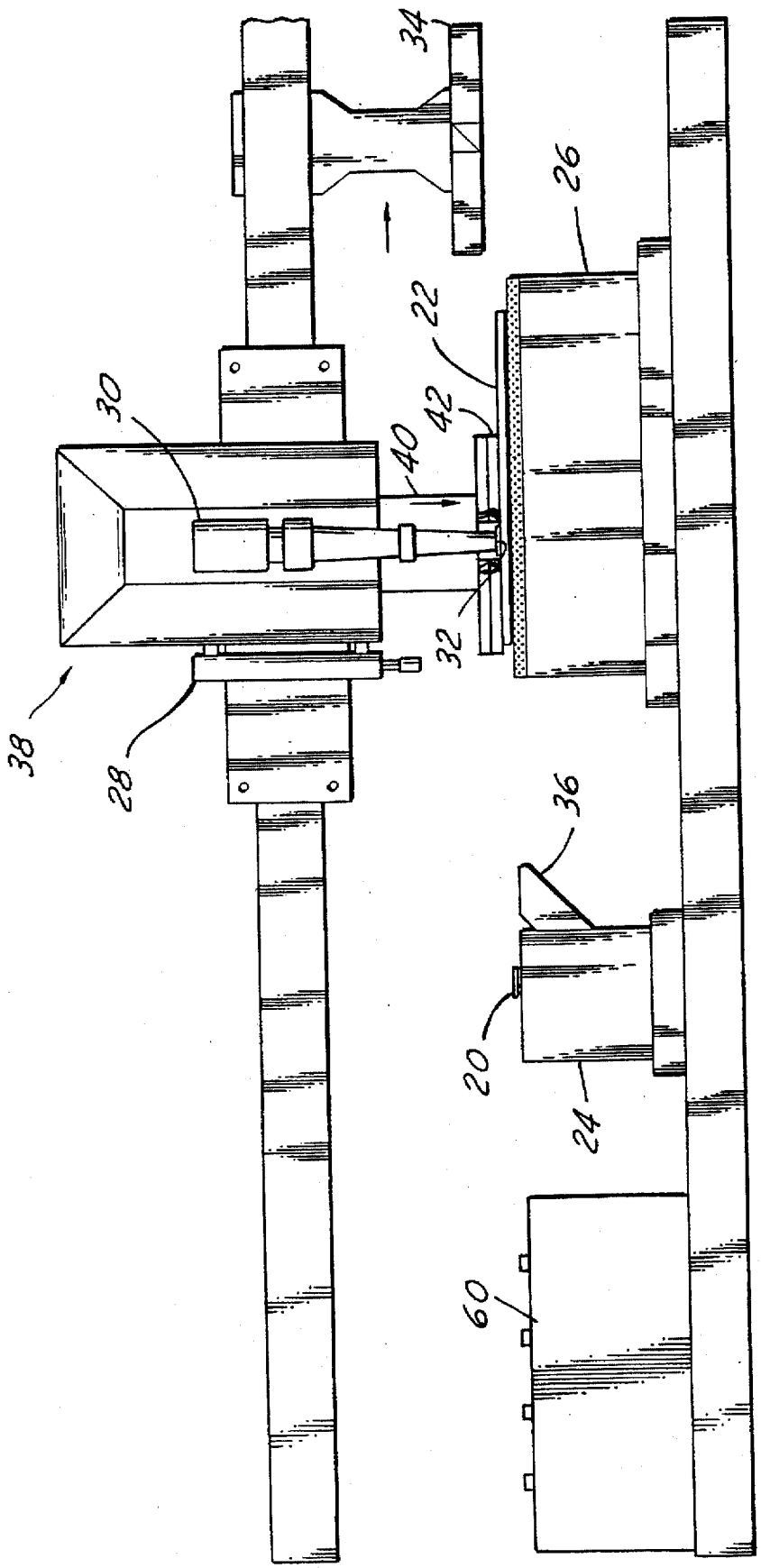
Figure 13B:
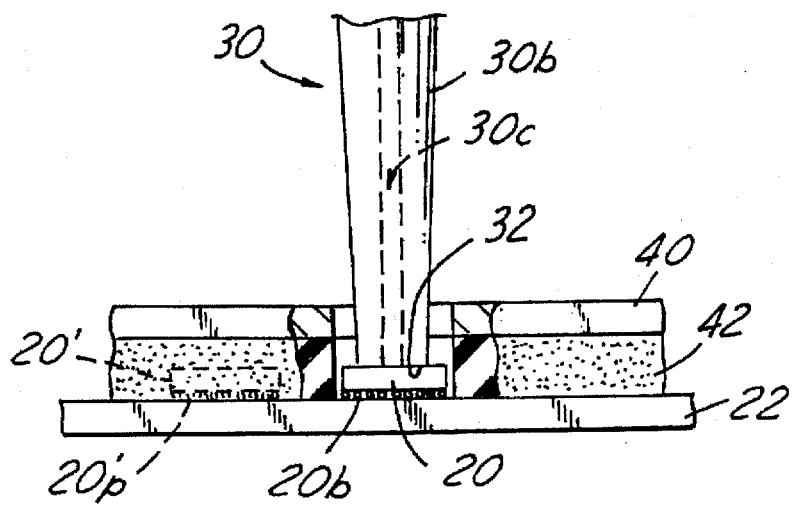

After this initial bias force, which may be fixed or varied as a function of time, is impressed upon the die 20 to secure it in know registration against the substrate 22, the vibration damper arm 40 is lowered such that the rubber pad 42 deforms around adjacent electrical components and die, as shown more clearly in FIG. 13B, so as to press firmly against the substrate 22. Since the size of the aperture 44 within the vibration damper arm 40 and the rubber pad 42 is larger than the die 20, the proper registration between the bumps on the underneath side of the die 20 should not be disturbed with respect to the circuit conductors on the substrate 22. The rubber pad 42 is sufficiently soft such that a force of only approximately 25 pounds per square inch will deform the rubber pad 42 around adjacent die and electrical components that have been previously placed on the substrate 22. However, the rubber pad 42 is sufficiently stiff and resilient so that it will absorb or dampen a major portion of the ultrasonic energy that is conducted from the ultrasonic horn 30 and through the die 20 and into the substrate 22. In this manner, the ultrasonic energy will not be transferred to the adjacent die and electrical components which could cause delamination of the various bonds, as will be discussed in more detail subsequently.

After the damper arm 40 is secured against the substrate 22, ultrasonic energy, within a range of 30,000 to 100,000 oscillations per second (with the preferred embodiment utilizing a 60,000 Hz frequency), is applied to the backside of the flip chip 20 for a predetermined time-period of up to about 10–20 seconds as illustrated in FIG. 13A. To complete the cycle (FIG. 14), the damper arm 40 and then the ultrasonic horn 30 retract, leaving the gold bumps 20b on the flip chip 20 joined to the substrate 22 by a secure diffusion bond.

X-ray photographs (not shown) of a flip chip 20 poised above a substrate 22 reveal a rectangular gray area is the backside of the substrate 22. In the aligned configuration, each dot represents a gold globule bump located on the active face of the flip chip 20. Extending away from the gold bumps is a bonding pattern which is defined by gold plated circuit traces or leads defined on the top surface of the substrate 22. Alignment or registration is enabled by the alignment device. Using the disclosed process and apparatus, all of the bumps disposed upon the flip chip are diffusion bonded simultaneously to the bonding sites defined upon the substrate.

Figure 13C:
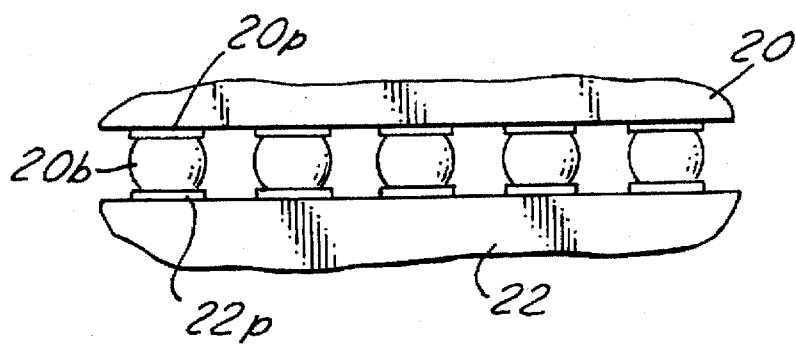

As illustrated in FIG. 13C, the plurality of gold bumps 20b are bonded to the conductive paths 20p, typically manufactured of aluminum or copper, on the lower side of the die 20. Since the gold bumps 20b are grown on the aluminum pads 20p of the semiconductor die 20, the ultrasonic energy used to bond the flip chip also affects the gold to aluminum interface and creates gold-aluminum intermetallic formations. These intermetallic formations range from the gold rich to the aluminum rich, among them the well known purple plague ($AuAl_2$) and the white plague ($Au_5Al_2$) intermetallic formations. Also, Kirkendahl voids, which are delaminations of the gold to aluminum interface, may be formed at this bonding interface. During the ultrasonic bonding process, the profile of the application of the bias force and the ultrasonic energy can be controlled so that the optimum bonding can be obtained and these undesirable affects can be avoided.

However, in the case where multiple flip chips are bonded sequentially onto the same substrate, the ultrasonic energy which is undesirably coupled into adjacent flip chips bonded previously onto the substrate can alter the intermetallic formations and cause the Kirkendahl voids to occur on these previously attached components. These failure modes are of special concern when the ultrasonic energy is applied normal, rather than horizontal to, the plane of the substrate. The damper forces used in the present invention substantially eliminate these undesirable side-effects.

Since the ultrasonic energy transfers through the vertical displacement of the ultrasonic element 30, it will be absorbed in large part by the formation of the intermetallic bonds between the die 20 and the substrate 22, rather than being lost due to the planar displacement of the die and the slippage between the die and the ultrasonic element that would take place if the ultrasonic motion would be in the horizontal plane. As a result, a relatively smaller amount of ultrasonic energy is required to complete the bonding when the motion is normal to the substrate 22. As used herein, the term normal to the substrate 22 should also imply that the ultrasonic motion will be normal to the horizontal plane of the die 20, since in typical operations the plane of the die 20 is parallel to the plane of the substrate 22.

The vertical ultrasonic bonding motion greatly reduces chip displacement found when the ultrasonic motion displaces the chip in the horizontal plane. Therefore, more accurate placement of the die 20 will allow the use of smaller fine-line geometries between the die 20 and the substrate 22 than is possible for processes using horizontal displacement.

Furthermore, since the ultrasonic motion is in a plane normal to the substrate 22, the distended end 32 of the ultrasonic tool 30 does not have to be custom designed to engage and hold the die 20 as is necessary for horizontal displacement processes. Therefore, the entire range of die sizes, that is from approximately 100 to 500 mils, can be covered using only approximately three ultrasonic elements that are pre-tuned and quickly interchangeable. This compares with the expense and time required to tune the natural frequency of the ultrasonic tools used in horizontal displacement systems which must take into account the mass of the horn and the attached die.

In practice, when the ultrasonic horn 30 is activated, microscopic surface contaminants and oxides are dispelled from the flip chip and the substrate, thereby producing an atomically clean surface for bonding.

Figure 15:
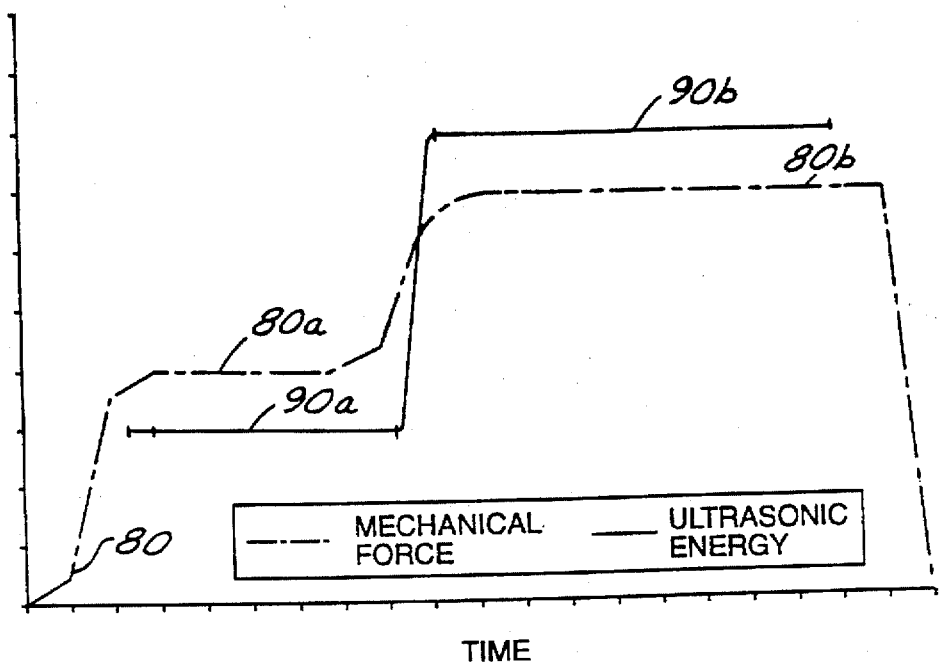
FIGS. 15 and 16 are graphs showing the time sequencing of the bias force and ultrasonic energy as they are applied to the flip chip.

As illustrated in FIG. 15, when the bias force 80 is applied to the flip chip 20, it is applied in stages. First, an initial bias force 80a of, for example, 5–10 pounds is applied (shown as the first plateau in the dashed line), followed by a second force 80b of up to 15–25 pounds. These forces are generated by electromagnetic transducers that can be transitioned (slewing) between the two pressures with a preferred ramping wave-form. As illustrated in FIG. 15, the initial period of ultrasonic energy 90a is applied for only approximately 3 seconds, which is about the first one-third of the approximately 10 second bonding period. This initial period of lower energy bonding 90a produces a "tacking bond" or "mechanical bond" that is sufficient to assist in holding the die 20 firmly in place with proper registration to the substrate 22 during the final or higher power bonding process 90b. After the higher pressure static force 80b is exerted upon the die 20 by the ultrasonic horn 30, the increased ultrasonic energy 90b is transferred to complete the full diffusion bonding process (also known as a "cold weld"). This higher energy bonding is required in order to permanently bond the die 20 onto the substrate 22. Of course, these bonding profiles will change depending on the die size, the number of bumps, and the materials used in the bumps.

This unique sequential profile of multiple force and energy levels, beginning at low values and moving to higher values, creates a significantly more reliable bond, as well as reducing misalignment between the die and the substrate. If the full ultrasonic energy 90b were to be applied at the beginning of the process, the die would vibrate and thereby cause potential misalignment and damage to the bumps on the die or the substrate circuit traces. This failure mode is entirely eliminated by the profile illustrated in FIG. 15 which sequentially increases the clamping force and ultrasonic energy. Furthermore, this pressure and energy profile avoids many of the over-bonded and under-bonded failure modes observed in horizontal displacement bonding processes.

Figure 16:
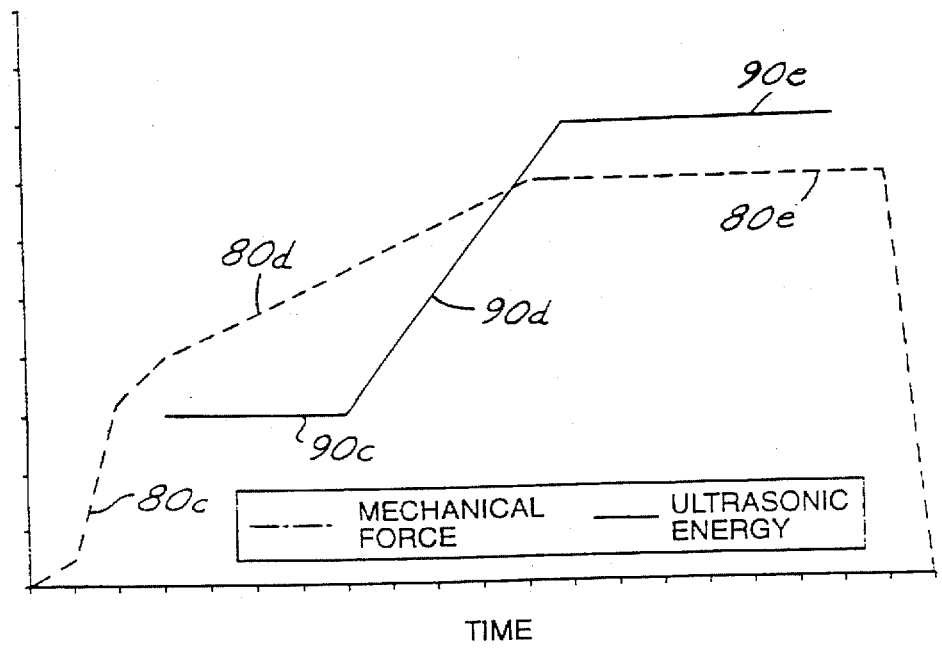

An alternative multi-level force and energy profile is illustrated in FIG. 16. According to this profile, the static compression force from the ultrasonic horn 30 ramps up sharply 80c until the initial lower level ultrasonic energy 90c is applied, and then the rate of increase of the static force is reduced 80d, although it still is increasing. After an initial "tacking period", the level of ultrasonic energy is increased rapidly 90d to a higher final bonding level 90e. The bias pressure of the ultrasonic horn 30 against the die 20 need not be increased further after it reaches plateau 80c, during which the higher level of ultrasonic bonding energy is transferred. It should be apparent to one skilled in the art that various multi-level bonding profiles may be utilized depending upon the size and shape of the die, the number of bumps, etc.

Figure 13D:
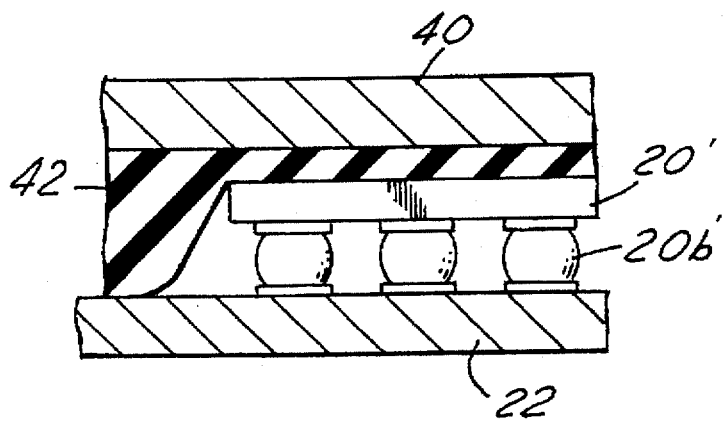
Figure 14:
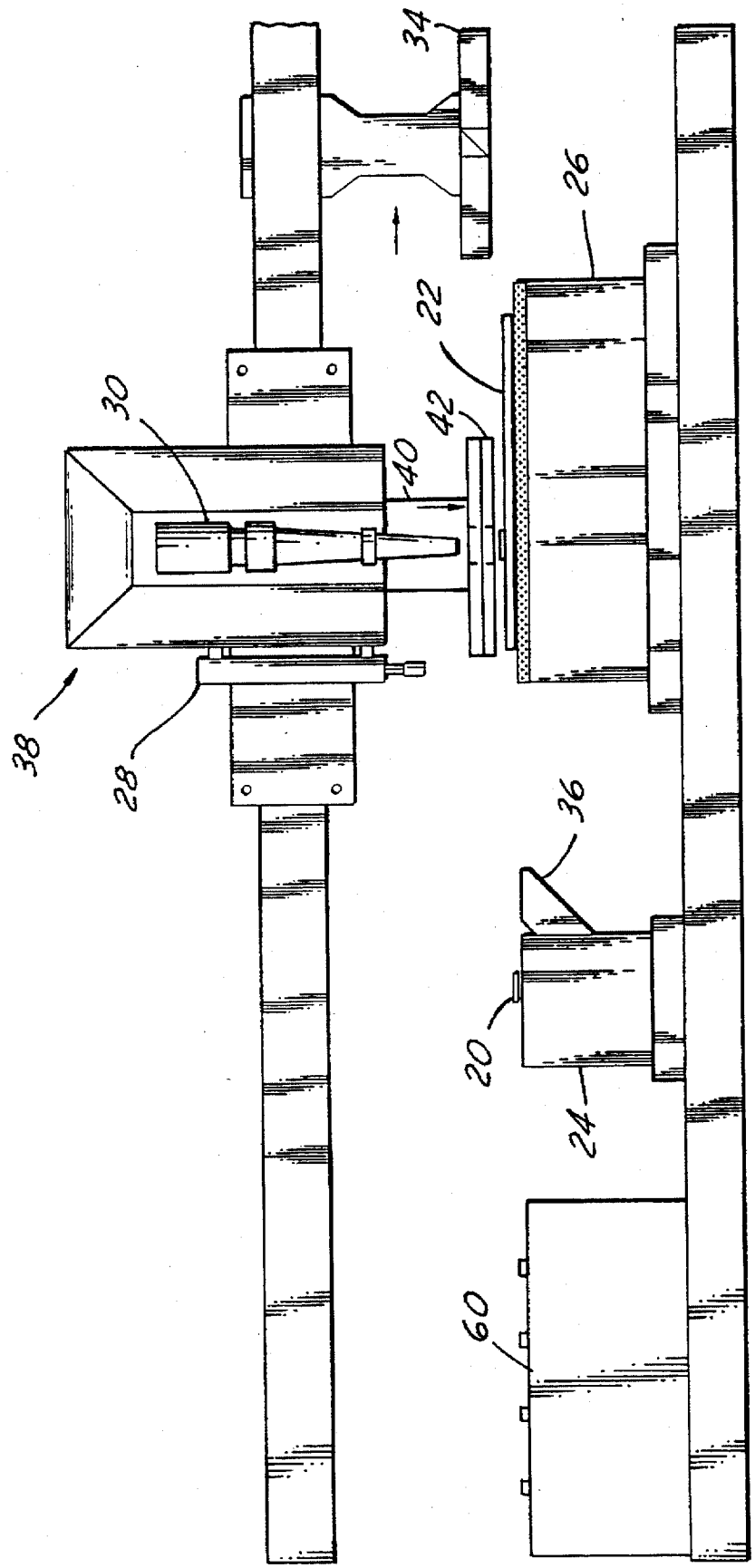

As illustrated in FIG. 13D, the ultrasonic forces induced by the ultrasonic horn plastically deform the gold bumps adjacent a region of contact between the flip chip and the substrate so that an intimate contact therebetween results and an intermetallic atomic bond is formed by isothermal ultrasonic energy. In practice, if there are three bumps per flip chip, a 1–2 pound force should suffice. If there are 250 bumps, for example, a force of 25–30 pounds should suffice if applied for a period of up to about 10–20 seconds, with 10 seconds being used in the best mode of the present invention.

With continuing reference to FIG. 13D and to FIG. 13C, the precise control of the pressure and ultrasonic energy profiles are helpful in controlling and eliminating any delamination that can occur in the intermetallic bonds that are used to construct the pads 22p on the substrate 22. The typical gold pad 22p includes a base layer of copper (approximately 1–2 mils), onto which an intermediate layer of nickel is plated (approximately 100–200 micrometers), followed by the final layer of soft gold (approximately 30–50 micrometers). It has been found that excessive absorption of the ultrasonic energy by this complex metallic structure, as located on die that had been bonded adjacent to the energized work area, may delaminate and fail due to the additional energy conducted by the substrate 22 and absorbed by the intermetallic interfaces. The same general failure modes are also observed in the complex intermetallic formations ($Al_xAu_y$) that hold the gold bump to the aluminum trace that traces on the die 20.

The vertical displacement process of the present invention is superior to those prior art processes requiring horizontal displacement because these prior art processes typically require the application of heat to either the die, the substrate or both. The addition of this supplemental heat energy further increases the probability of the intermetallic failures between the substrate, the gold bump and the die.

Thus, it will be apparent that the disclosed process and apparatus requires no heat, no solder, and is quick. Since no heat is required, the apparatus and process can be used for heat sensitive substrate flip chip bonding media and produces less damage to the flip chip compared to thermocompression bonding or solder reflow. Throughput is enhanced because an entire flip chip can be bonded to a substrate regardless of the number of connections. Finally, since all forces are in the vertical (Z) direction, there is no relative horizontal movement between the flip chip and the substrate.

In practice, substrates up to about 14 inches square may be accommodated within the disclosed apparatus. Flip chips as small as 0.05 inches square may be handled. Flip chips 1 inch square may also be effectively used by the disclosed process.

The disclosed invention not only improves bonding accuracy but also facilitates throughput because the pickup tool is also the bonding tool. This eliminates the need to place, retract, and engage the flip chip with the horn. The disclosed apparatus is a semi-automatic system for producing high density packaging applications which require high alignment and bonding accuracy of flipped chips to the substrate.

While the present preferred embodiment has been described with reference to gold bumps 20b that are bonded to the die 20, it should be apparent that the bumps may be formed from any deformable and fusible material that will create long-lasting intermetallic with the adjacent materials. Gold is preferred because it will not oxidize and is especially workable in the diffusion bonding process as described herein. However, appropriate adjustments in the bonding profile and metal substrates can be employed to bond flexible cables to the substrate and the die or to form a cable to cable bond using essentially the same process as disclosed herein.

The ultrasonic transducer and horn of the disclosed apparatus may be manufactured in various forms. One suitable vendor is Uthe Technology of Milpitas, Calif. The disclosed ultrasonic transducer and horn is a model 506 FO, which may be driven at the 6 watt and then the 20 watt power levels in the profile shown in FIG. 15.

One type of flip chip attachment apparatus is manufactured by R D Automation of Piscataway, N.J. (Model AFC-101-AP). The machine produces alignment accuracy of better than±5 microns. Throughput levels up to 350–500 flip chips per hour are possible depending upon the process parameters. In one system (M-8 flip chip bonder), a thin optical probe is inserted between the flip chip and the substrate, imaging both bonding surfaces simultaneously. Two video cameras and reflection illuminators are used to view the flip chip and the substrate individually. Outputs of the video systems are superimposed on one screen and the alignment is achieved by moving the substrate in reference to the stationary flip chip. Final alignment is performed when the flip chip is in close proximity to its final position, after which there is no motion in the X, Y, or theta directions. The only axes upon which motion may remain is in the vertical (Z) direction.

Although the present invention has been described in conjunction with the best mode of its process and the preferred embodiment of the apparatus, one skilled in this art will understand that other equivalent implementations are intended to be covered, and not limited by, the following claims.

We claim:

1. An apparatus for bonding a flip chip to a substrate comprising:

a base;

an ultrasonic horn which is movable in a vertical direction with respect to said base, said ultrasonic horn including at a distended end thereof a vacuum channel which, when operatively coupled to a vacuum source, holds the flip chip against said distended end thereof; and a work holder, secured to the base, for supporting a substrate to which the flip chip may be bonded upon application of static pressure and delivery of oscillating energy by said ultrasonic horn in a direction normal to the substrate.

2. The apparatus of claim 1, further including means for aligning the flip chip in horizontal relationship to the substrate.

3. The apparatus of claim 1, further including:
a flip chip pickup table attached to the base;
a flip chip pickup arm positionable above a flip chip disposed upon said flip chip pickup table; and
a squaring device located adjacent to said flip chip pickup table for orienting the flip chip in a known registration.

4. The apparatus of claim 1, further including damper means, spaced circumferential to the flip chip, for being forced into communication with the substrate for inhibiting the transmission of ultrasonic energy therethrough, whereby the ultrasonic energy will not be transmitted to or disruptive of other diffusion bonds coupled to the substrate.

5. The apparatus of claim 1 further including:
a nest for holding multiple ones of said distended ends of said ultrasonic horns, and
means for interchangeably coupling said ultrasonic horn to one of said distended ends in said nest, and removing it therefrom.

6. An apparatus for bonding the bumps on a flip chip to a substrate, comprising:
a base;
an ultrasonic horn, including a distended end thereof for holding the flip chip, for generating ultrasonic energy through oscillations in a direction normal to the substrate;
a base for holding the substrate onto which the flip chip is to be bonded;
first means for exerting bias forces for maintaining a known registration of the flip chip with respect to the substrate during application of the ultrasonic energy to bond the bumps between the flip chip and the substrate.

7. The apparatus described in claim 6 where said bias forces from said first means are applied prior to initiating the application of the ultrasonic energy.

8. The apparatus as described in claim 6 further including vibration isolation means for communicating with the substrate in proximity to the die for inhibiting the transfer of ultrasonic energy from the ultrasonic horn, through the substrate, to adjacent components previously mounted onto the substrate.

9. The apparatus as described in claim 7 wherein said vibration isolation means comprises an easily deformable material for being pressed against the substrate adjacent to said ultrasonic horn.

10. The apparatus as described in claim 9 wherein said easily deformable material has an elasticity range for absorbing more than a majority of the ultrasonic energy imparted from said ultrasonic horn to the substrate for reducing the probability of delaminating similar gold bumps bonding adjacent flip chips to the substrate.

* * * * *